(12) United States Patent
Fujikawa et al.

(10) Patent No.: US 8,324,063 B2
(45) Date of Patent: Dec. 4, 2012

(54) EPITAXIAL FILM GROWING METHOD, WAFER SUPPORTING STRUCTURE AND SUSCEPTOR

(75) Inventors: Takashi Fujikawa, Tokyo (JP); Seiji Sugimoto, Tokyo (JP)

(73) Assignee: Sumco Corporation, Tokyo (JP)

( * ) Notice: Subject to any disclaimer, the term of this patent is extended or adjusted under 35 U.S.C. 154(b) by 310 days.

(21) Appl. No.: 12/682,850

(22) PCT Filed: Nov. 6, 2008

(86) PCT No.: PCT/JP2008/070235
§ 371 (c)(1),
(2), (4) Date: Apr. 13, 2010

(87) PCT Pub. No.: WO2009/060912
PCT Pub. Date: May 14, 2009

(65) Prior Publication Data
US 2010/0227455 A1    Sep. 9, 2010

(30) Foreign Application Priority Data
Nov. 8, 2007 (JP) .................................. 2007-291338

(51) Int. Cl.
*H01L 21/331* (2006.01)

(52) U.S. Cl. ........ 438/357; 438/363; 438/413; 438/416; 438/481; 257/E21.09

(58) Field of Classification Search .................. 438/357, 438/363, 413, 416, 481; 257/E21.09
See application file for complete search history.

(56) References Cited

U.S. PATENT DOCUMENTS
2009/0235867 A1    9/2009    Fujikawa et al.
2010/0029066 A1    2/2010    Miyashita FOREIGN PATENT DOCUMENTS
| JP | 7-058041 | 3/1995 |
| JP | 9-052792 | 2/1997 |
| JP | 9-266242 | 10/1997 |
| JP | 11-176916 | 7/1999 |
| JP | 2003-229370 | 8/2003 |

*Primary Examiner* — Bradley K Smith
*Assistant Examiner* — Amar Movva
(74) *Attorney, Agent, or Firm* — Greenblum & Bernstein, P.L.C.

(57) ABSTRACT

An annular step portion provided to a periphery of a wafer housing portion is provided to an area with which an area of 1 to 6 mm from a boundary line with a chamfered surface of a wafer rear surface toward a wafer center comes in contact. As a result, it is possible to produce an epitaxial wafer having no scratch in a boundary area between the rear surface and the chamfered surface, and to eliminate particles generated due to a scratch in a device process.

11 Claims, 7 Drawing Sheets

Substrate holding position [mm]

Distance between upper surface of shoulder end portion and upper surface of substrate [μm]

EPITAXIAL FILM GROWING METHOD, WAFER SUPPORTING STRUCTURE AND SUSCEPTOR

BACKGROUND OF THE INVENTION

1. Field of the Invention

The present invention relates to a method of growing an epitaxial film, a wafer supporting structure, and a susceptor. More specifically, the present invention relates to a method of growing an epitaxial film in which an epitaxial film is grown on a front surface of a semiconductor wafer by vapor-phase epitaxial growth, a wafer supporting structure, and a susceptor.

2. Description of Related Art

With increasing wafer diameter these days, a single-wafer type vapor-phase epitaxial growth apparatus is widely used, in order to grow an epitaxial film on a front surface of a silicon wafer. In a single-wafer type apparatus, a silicon wafer is first placed on a susceptor installed in a passageway-shaped reactor (chamber). Subsequently, when being heated by a heater provided external to the reactor, the silicon wafer is reacted with a variety of source gases (raw material gas and reactive gas), which pass through the reactor. Thereby, an epitaxial film is grown on a wafer front surface.

A widely used susceptor has a circular shape from a plan view, on which a single wafer is mountable. The type of susceptor is used in order to evenly heat a wafer having a large diameter, such as, for example, a circular silicon wafer having a diameter of 300 mm, and to supply source gas on an entire wafer front surface; and thereby to evenly grow an epitaxial film. A wafer housing portion having a recess shape is provided in a central portion of an upper surface of the susceptor, so as to house a silicon wafer having front and rear surfaces positioned horizontally. A recent susceptor generally supports a silicon wafer in a boundary area with a chamfered surface of a rear surface of the silicon wafer (for example, Related Art 1). In order to provide a wafer supporting position in the boundary area, one method is to evenly reduce a thickness of a central portion of a bottom plate of the wafer housing portion, and thereby to provide a step around an external peripheral portion of the bottom plate. The other method is to cut out in a circular shape the central portion of the bottom plate of the wafer housing portion, and thereby to provide the bottom plate having a ring shape. The boundary area means an area of less than 1 mm internally and externally in a direction of a wafer diameter, centering a boundary line with the chamfered surface of the rear surface of the silicon wafer.

Silicon carbide (SiC) has conventionally been employed as material of a susceptor front surface. Thus, the susceptor has a greater hardness than the silicon wafer. Further, the susceptor has a higher coefficient of thermal expansion than the silicon wafer, as the coefficient of thermal expansion of SiC is $4.8 \times 10^{-6}$/k and that of Si is $2.5 \times 10^{-6}$/k. Due to the difference in the coefficient of thermal expansion, the boundary area of the wafer rear surface and an upper edge of an internal periphery of the external peripheral portion of the bottom plate of the wafer housing portion are in friction at a time of epitaxial growth, when a temperature inside the chamber is high. As a result, scratches are caused in the boundary area of the silicon wafer, which is softer than the susceptor. The scratch has a groove-like shape similar to a hangnail caused in a portion that rims a base of a nail (a rip or a hangnail injury). A planar shape of the scratch is a line, a dot, and the like. A cross-sectional shape thereof is a V-shaped notch and the like.

Related Art 1: Japanese Patent Laid-open Publication No. 2003-229370

With microprocessing in a device process, however, problems described below occur when scratches exist on the rear surface of the silicon wafer in the boundary area between the chamfered surface and the wafer rear surface. Specifically, when the silicon wafer is immersed in an etching solution or ultrapure water in the device process, particles are generated from the scratched portion. The particles then move to a front surface side of the wafer, and are deposited on the wafer front surface (device formed surface). Thus, a yield in the device process is reduced.

Recently, device manufacturers demand ultra-high flatness for a front surface of an epitaxial film. To meet the demand, it is necessary to prevent a film from forming on a rear surface in an external periphery end portion (up to around 6 mm from an edge) of the wafer rear surface, as source gas moves to the wafer rear surface side at the time of epitaxial growth. The film forming phenomena on the rear surface fluctuates a distribution of film forming on the rear surface in the wafer external peripheral area, and fluctuates a total thickness of the wafer; thus preventing the ultra flatness of the epitaxial wafer. To prevent the film forming phenomena on the rear surface is thus another problem.

SUMMARY OF THE INVENTION

The present invention provides a method of growing an epitaxial film, a wafer supporting structure, and a susceptor, the method being capable of producing an epitaxial wafer free from a scratch in a boundary area with a chamfered surface on a rear surface of a semiconductor wafer, and thus being capable of preventing generation of particles caused by the scratch in a device process.

A first aspect of the invention provides a method of growing an epitaxial film in which a semiconductor wafer is housed in a wafer housing portion provided by caving in a portion of an upper surface of a susceptor, and an epitaxial film is grown on a front surface of the semiconductor wafer by vapor-phase epitaxial growth. In the method, the wafer housing portion is a space demarcated by a bottom plate portion constituting a bottom wall of the wafer housing portion; an annular step portion provided to a periphery of the bottom plate portion and supporting the semiconductor wafer; and a peripheral wall provided to a periphery of the step portion. The epitaxial film is grown on the front surface of the semiconductor wafer, while a rear surface of the semiconductor wafer is in surface or line contact in a predetermined range of an area of 1 to 6 mm from a boundary line with a chamfered surface toward a center position of the wafer, and a predetermined position of the area is supported by an upper edge of an internal periphery of the annular step portion.

According to the first aspect of the invention, the semiconductor wafer is housed in the wafer housing portion of the susceptor in a state in which the predetermined range of the area of 1 to 6 mm from the boundary line between the rear surface and the chamfered surface of the semiconductor wafer (circle formed as a flat surface and a curved surface are contacted) toward the wafer center position is in surface or line contact with the annular step portion. When the semiconductor wafer is placed on the annular step portion as described above, the upper edge of the internal periphery of the annular step portion is a wafer supporting position due to self-weight of the semiconductor wafer. The semiconductor wafer and the susceptor are thermally expanded at a time of vapor-phase epitaxial growth. Since the coefficient of thermal expansion is different between the semiconductor wafer and the susceptor, however, the supporting position of the semiconductor wafer is in friction with the annular step portion of the susceptor, thus causing scratches in the area of 1 to 6 mm from the boundary area toward the wafer center position. It is possible, however, to produce an epitaxial wafer free from scratches in the boundary area between the semiconductor wafer rear surface and the chamfered surface, the scratches having been a conventional issue.

As a result, even when particles are generated from scratches in a device process thereafter in which the epitaxial wafer is immersed in treatment solutions, such as, for example, an etching solution, ultrapure water, and the like, it is less likely to cause defective devices due to particles moving to the wafer front surface side and deposited on the front surface of the epitaxial film, compared with a case in which scratches exist in the boundary area with the chamfered surface. The reason is that a distance from the external peripheral end of the wafer rear surface to the scratched positions is longer than the conventional one. Thus, the device yield can be increased. Further, when the etching solution, ultrapure water, and the like, are contacted only on the front surface and the external peripheral portion of the epitaxial wafer, particles can clearly be prevented from being generated. Thus, when the number of particles on the front surface of the epitaxial film is counted using a particle counter, after the epitaxial wafer is immersed in a variety of treatment solutions (etching solution, ultrapure water, and the like), the number of particles can be reduced as a whole film to ¹⁄₁₀ or less of a case in which scratches exist in the boundary area.

A monocrystalline silicon wafer, a polycrystalline silicon wafer, and the like, for instance, can be employed as the semiconductor wafer. A diameter of the semiconductor wafer may be determined as desired, such as, for example, 6 inches, 8 inches, and 300 mm or larger. Silicon same as the wafer (monocrystalline silicon and polycrystalline silicon) can be employed as material of the epitaxial film. Alternatively, material different from the wafer may be used, such as, for example, gallium, arsenic, and the like. A thickness of the epitaxial film is a few μm to 150 μm for bipolar devices and power devices, and 10 μm to 0.5 μm for MOS devices.

Examples of the vapor-phase epitaxial method may include an atmospheric vapor-phase epitaxial method, a reduced-pressure vapor-phase epitaxial method, an organic metal vapor-phase epitaxial method, and the like. In the vapor-phase epitaxial method, for example, an epitaxial wafer is housed laterally (a state in which front and rear surfaces are placed horizontally) in the caved-in portion (wafer housing portion) having a recess shape. When the wafer is housed, the annular step portion provided to the periphery of the bottom plate of the caved-in portion is contacted with the predetermined range of the area of 1 to 6 mm from the boundary line between the rear surface and the chambered surface of the epitaxial wafer. The annular contact line having the predetermined width is a wafer supporting line. A susceptor having an annular shape (ring shape or doughnut shape) from a plan view can also be used. Examples of components of source gas may include $SiHCl_3$ (trichlorosilane), $SiH_2Cl_2$ (dichlorosilane), and the like.

When the supporting position of the semiconductor wafer provided by the annular step portion is less than 1 mm from the boundary line between the rear surface and the chamfered surface of the wafer toward the wafer center position, scratches are generated in a location proximate to the boundary area of the rear surface and chamfered surface of the wafer. Thus, more particles are generated at a time of immersion in a variety of treatment solutions. When the supporting position of the semiconductor wafer provided by the annular step portion exceeds 6 mm from the boundary line between the rear surface and the chamfered surface of the wafer toward the wafer center position, an amount of film forming on the rear surface is increased due to source gas moving to the wafer rear surface side. Thus, when the wafer is placed on a stage of an exposure machine, for instance, a portion of film forming on the rear surface due to the moving to the wafer rear surface side coincides with an external peripheral portion of a vacuum point of the exposure machine. As a result, ultra flatness cannot be achieved, and defocusing due to exposure occurs. A preferable supporting position of the rear surface of the semiconductor wafer provided by the annular step portion is an area of 1 to 3 mm from the boundary line between the rear surface and the chamfered surface of the semiconductor wafer toward the wafer center position. In the area, particles can be prevented from being generated, while the amount of silicon film forming on the rear surface is reduced.

Examples of a shape of the supporting portion of the semiconductor wafer provided by the annular step portion may include a cross-sectional triangle, a flat (FIG. 7), a reverse slope (FIG. 6), and the like. When a temperature of an epitaxial furnace is increased to a temperature of 700° C. or higher and 1,000° C. or less, and a wafer is housed on the susceptor, the wafer is warped downward in a dent shape due to self-weight. Thus, even when the annular step portion has a flat shape, a supporting structure can be provided in which the supporting position of the wafer rear surface is positioned at 1 to 6 mm from the boundary line with the chamfered surface of the wafer rear surface toward the wafer center position. Further, the scratch is a cut or rip having a depth of 0.5 μm or greater and a length of 1 μm or greater. In other words, the scratch is like a groove similar to a hangnail caused in a portion that rims a base of a nail (hangnail injury). A planar shape of the scratch is a line, a dot, and the like. A cross-sectional shape thereof is a V-shaped notch and the like.

When the size of the scratch is less than 0.5 μm in depth and less than 1 μm in length, the number of particles is small even when particles are generated from the scratch at the time of immersion in the etching solution, ultrapure water, and the like in the device process. Thereby, it is unlikely that the particles move to the wafer front surface side and are deposited on the wafer front surface, and thus that the device yield is decreased due to the scratch. The size of frequently occurred scratches (hangnail injuries) on the wafer rear surface is 0.5 to 5 μm in depth and 5 to 100 μm in length. A carbon substrate coated with SiC on a front surface and the like, for example, can be employed as susceptor material.

A second aspect of the invention provides the method of growing the epitaxial film according to the first aspect, wherein the rear surface of the semiconductor wafer and the upper edge of the internal periphery of the annular step portion are in surface contact; of the annular step portion, a portion in surface contact with the rear surface of the semiconductor wafer is an annular projection having a flat upper surface; and the annular projection has a width in a diameter direction of the step portion of 1 to 6 mm and a height from the upper surface of the step portion of 10 to 250 μm, and is provided to the step portion having a distance from the peripheral wall in the diameter direction of the step portion.

According to the second aspect of the invention, the annular projection having the flat upper surface is provided to the annular step portion in the portion that comes in surface contact with the rear surface of the semiconductor wafer. In addition, providing the annular projection with the width in the diameter direction of the step portion (width of the upper surface) of 1 to 6 mm can reduce damage to the wafer rear surface in the portion that comes in contact with the step portion. Furthermore, providing the annular projection with the height from the upper surface of the step portion of 10 to 250 µm can concurrently reduce the thickness of the film forming on the rear surface due to source gas moving to the wafer rear surface side. The reduction in the film thickness improves evenness of thickness distribution within the wafer surface of the semiconductor wafer, and thus facilitates achievement in ultra flatness of the epitaxial wafer.

When the width of the annular projection in the diameter direction of the step portion is less than 1 mm, stability is reduced in holding the semiconductor wafer. When the width exceeds 6 mm, the effect of the present invention cannot be achieved, which is to concurrently achieve reduction in damage to the portion that comes in contact with the step portion and reduction in the thickness of the film forming on the rear surface due to source gas moving to the wafer rear surface side. A further preferable width of the annular projection in the diameter direction of the step portion is 2 to 5 mm. Within the range, a further favorable effect of producing a quality wafer can be obtained, the quality wafer having the number of front surface particles of 1/10 or less of a conventional wafer and the amount of film forming on the wafer rear surface of 40 nm or less. When the height of the annular projection from the upper surface of the step portion is less than 10 µm, it is difficult to form the annular projection since the annular projection is too minute. When the height exceeds 250 µm, a gap is too wide between the upper surface of the annular step portion and the wafer rear surface, and thus the amount of film forming on the wafer rear surface might be increased. A preferable height of the annular projection from the upper surface of the step portion is 10 to 200 µm. Within the range, a temperature around the external peripheral portion of the semiconductor wafer is further uniformed, and thereby a slip formation can be prevented. The distance of the annular projection from the peripheral wall in the diameter direction of the step portion is, for example, 2.25 to 4 mm. Within the range, damage can be reduced caused by contact between the peripheral wall provided to the periphery of the step portion and the semiconductor wafer.

A third aspect of the invention provides a wafer supporting structure when an epitaxial film is grown on a front surface of a semiconductor wafer placed on a susceptor in a vapor-phase epitaxial method. In the wafer supporting structure, the susceptor has a wafer housing portion having a bottom plate portion, an annular step portion provided to a periphery of the bottom plate portion and supporting the semiconductor wafer, and a peripheral wall provided to a periphery of the step portion; and, of a rear surface of the semiconductor wafer, a predetermined position of an area of 1 to 6 mm from a boundary line with a chamfered surface toward a center position of the wafer is supported by the annular step portion.

According to the third aspect of the invention, the supporting position is the area of 1 to 6 mm from the boundary line between the rear surface and the chamfered surface of the semiconductor wafer toward the wafer center position, and the semiconductor wafer is placed on the annular step portion of the wafer housing portion. In the state, the semiconductor wafer and the susceptor are thermally expanded at a time of vapor-phase epitaxial growth. Since a coefficient of thermal expansion is different between the semiconductor wafer and the susceptor, however, the semiconductor wafer is in friction with the annular step portion of the susceptor at the supporting position of the semiconductor wafer, thus causing scratches in the area of 1 to 6 mm from the boundary area toward the wafer center position. It is possible, however, to produce an epitaxial wafer free from scratches in the boundary area between the semiconductor wafer rear surface and the chamfered surface, the scratches having been a conventional issue.

As a result, even when particles are generated from scratches in a device process thereafter in which the epitaxial wafer is immersed in treatment solutions, such as, for example, an etching solution, ultrapure water, and the like, it is less likely to cause defective devices due to particles moving to the wafer front surface side and deposited on the front surface of the epitaxial film, compared with a case in which scratches exist in the boundary area with the chamfered surface. The reason is that a distance from the external peripheral end of the wafer rear surface to the scratched positions is longer than the conventional one. Thus, the device yield can be increased. Further, when treatment solutions, such as an etching solution, ultrapure water, and the like, are contacted only on the front surface and the external peripheral portion of the epitaxial wafer, particles can clearly be prevented from being generated.

A fourth aspect of the invention provides the wafer supporting structure according to the third aspect, wherein the semiconductor wafer is supported while being in surface contact with the annular step portion.

A fifth aspect of the invention provides the wafer supporting structure according to the fourth aspect, wherein, of the annular step portion, a portion in surface contact with the rear surface of the semiconductor wafer is an annular projection having a flat upper surface; and the annular projection has a width in a diameter direction of the step portion of 1 to 6 mm and a height from the upper surface of the step portion of 10 to 250 µm, and is provided to the step portion having a distance from the peripheral wall in the diameter direction of the step portion.

According to the fifth aspect of the invention, the annular projection is provided to the annular step portion in the portion that comes in surface contact with the rear surface of the semiconductor wafer, the annular projection having the flat upper surface, the width in the diameter direction of the step portion of 1 to 6 mm, and the height from the upper surface of the step portion of 10 to 250 µm. As a result, it is possible to concurrently achieve reduction in damage to the wafer rear surface in the portion that comes in contact with the step portion, and reduction in the thickness of the film forming on the rear surface due to source gas moving to the wafer rear surface side.

A sixth aspect of the invention provides the wafer supporting structure according to the third aspect, wherein the semiconductor wafer is supported while being in line contact with the annular step portion.

A seventh aspect of the invention provides the wafer supporting structure according to one of the third to sixth aspects, wherein an upper end surface of the peripheral wall of the wafer housing portion is higher than the front surface of the semiconductor wafer housed in the wafer housing portion; and a height difference is 100 to 500 µm between the upper end surface of the peripheral wall of the wafer housing portion and the front surface of the semiconductor wafer.

According to the seventh aspect of the invention, a supporting position is provided in the area of 1 to 6 mm from the boundary line between the rear surface and the chamfered surface of the semiconductor wafer toward the wafer center position, and the semiconductor wafer is placed on the annular step portion. A gap then tends to be generated between the rear surface of the semiconductor wafer and the annular step portion, thus likely to cause film forming on the rear surface. Causes include warping of the wafer due to temperature and the shape of the annular step portion. In addition, the height difference is 100 to 500 µm between the upper end surface of the peripheral wall of the wafer housing portion and the front surface of the semiconductor wafer housed in the wafer housing portion. Thereby, growth of source gas components (film forming on the rear surface) can be avoided at the external peripheral end of the wafer rear surface, as source gas moves to the wafer rear surface side at a time of epitaxial growth.

Carrier gas (hydrogen), including source gas, which is supplied from a narrow gas inlet to the chamber, passes through the upper end surface of the peripheral wall of the wafer housing portion. Thereafter, the carrier gas passes through the wafer front surface, and then is discharged outside the chamber through a gas outlet provided opposite to the gas inlet. When the wafer front surface (upper surface) is positioned higher than the upper end surface of the peripheral wall of the wafer housing portion, the supplied gas impinges on the end surface of the wafer. Then, a portion of the gas flows toward the wafer rear surface side, and thus a silicon film tends to be formed on the wafer rear surface. When the wafer front surface is therefore positioned lower than the upper end surface of the peripheral wall of the wafer housing portion, the gas flow toward the wafer rear surface side can be prevented, and consequently the amount of film forming on the rear surface can be prevented. When the wafer upper surface is positioned substantially lower than the upper end surface of the peripheral wall of the wafer housing portion, a swirl or turbulence tends to occur on the upper end surface of the peripheral wall of the wafer housing portion. Lowering the position of the wafer upper surface by 100 to 500 µm relative to the upper end surface of the peripheral wall of the wafer housing portion, prevents film forming on the external periphery of the wafer rear surface, thus reducing a fluctuation amount of the total thickness of the wafer. Thereby, ultra flatness of the epitaxial wafer can be achieved.

When the height difference is less than 100 µm between the upper end surface of the peripheral wall of the wafer housing portion and the front surface of the semiconductor wafer housed in the wafer housing portion, the amount of film forming on the rear surface is increased. When the height difference exceeds 500 µm, it may be difficult to control distribution of film forming on the wafer front surface side, even though the amount of film forming on the rear surface can be reduced.

An eighth aspect of the invention provides a susceptor on which a semiconductor wafer is placed when an epitaxial film is grown on a front surface of the semiconductor wafer in a vapor-phase epitaxial method. The susceptor has a wafer housing portion having a bottom plate portion, an annular step portion provided to a periphery of the bottom plate portion and supporting the semiconductor wafer in surface contact, and a peripheral wall provided to a periphery of the step portion; of the annular step portion, a portion in surface contact with a rear surface of the semiconductor wafer is an annular projection having a flat upper surface; and the annular projection has a width in a diameter direction of the step portion of 1 to 6 mm and a height from the upper surface of the step portion of 10 to 250 µm, and is provided to the step portion having a distance from the peripheral wall in the diameter direction of the step portion.

According to the eighth aspect of the invention, the annular projection is provided to the annular step portion in the portion that comes in surface contact with the rear surface of the semiconductor wafer, the annular projection having the flat upper surface, the width in the diameter direction of the step portion of 1 to 6 mm, the height from the upper surface of the step portion of 10 to 250 µm, and the distance from the peripheral wall. As a result, it is possible to concurrently achieve reduction in damage to the wafer rear surface in the portion that comes in contact with the step portion, and reduction in the thickness of the film forming on the rear surface due to source gas moving to the wafer rear surface side.

According to the first through eighth aspects of the invention, the supporting position is provided in the area of 1 to 6 mm from the boundary line between the rear surface and the chamfered surface of the semiconductor wafer toward the wafer center position, and the semiconductor wafer is supported by the susceptor. Thus, the wafer rear surface is in friction with the annular step portion in the wafer housing portion (caved-in portion) of the susceptor at the time of vapor-phase epitaxial growth, due to the difference in the coefficient of thermal expansion. It is then likely that scratches occur on the wafer rear surface. The scratched positions are not, however, in the boundary area of the rear surface and the chamfered surface of the wafer as is the case with conventional methods, but are in the area of 1 to 6 mm therefrom toward the center portion of the wafer. As a result, the distance from the most external peripheral edge of the wafer is longer. Thereby, when the semiconductor wafer is immersed in treatment solutions after the epitaxial growth process, such as, for example, when the semiconductor wafer is immersed in solutions and exposed in the device process, particles can be prevented from being deposited on the wafer front surface, the particles being generated from the supporting area of the wafer rear surface and moving to the wafer front surface side as the external peripheral portion of the wafer is immersed in chemicals. Thus, deterioration in flatness of the wafer front surface due to the particle deposition can be prevented, and thereby the device yield can be improved.

According to the second, fifth, and eighth aspects of the invention in particular, the annular projection is provided to the annular step portion in the portion that comes in surface contact with the rear surface of the semiconductor wafer, the annular projection having the flat upper surface, the width in the diameter direction of the step portion of 1 to 6 mm, and the height from the upper surface of the step portion of 10 to 250 µm. As a result, it is possible to concurrently achieve reduction in damage to the wafer rear surface in the portion that comes in contact with the step portion, and reduction in the thickness of the film forming on the rear surface due to source gas moving to the wafer rear surface side.

According to the seventh aspect of the invention, the upper end surface of the peripheral wall of the wafer housing portion is higher than the front surface of the semiconductor wafer housed in the wafer housing portion (height difference: 100 to 500 µm). Thereby, growth of source gas components can be avoided at the external peripheral end of the wafer rear surface, as source gas moves to the wafer rear surface side at the time of epitaxial growth. Consequently, fluctuation of the total thickness of the semiconductor wafer in the external peripheral area can be reduced, and thus ultra flatness of the front surface of the epitaxial wafer can be achieved.

Figure 1:
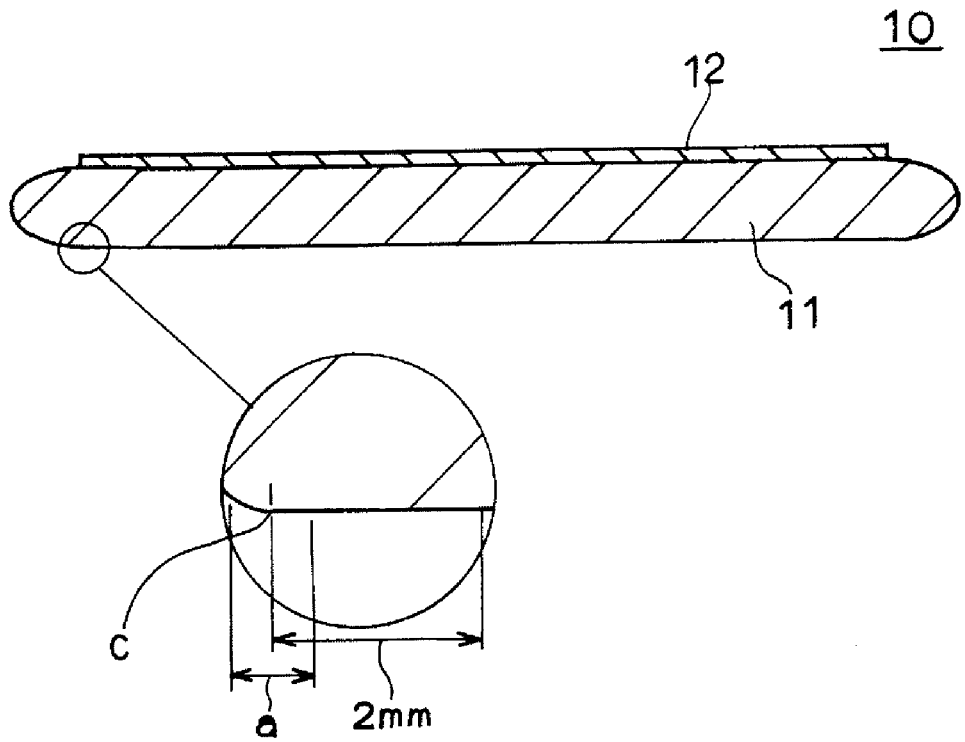
FIG. 1 is an enlarged vertical cross-sectional view of an epitaxial wafer on which an epitaxial film is grown in a method of growing an epitaxial film using a wafer supporting structure, according to a first embodiment of the present invention.

10 Epitaxial wafer
11 Silicon wafer (semiconductor wafer)
12 Epitaxial film
13, 13A to 13E Susceptor for vapor-phase growth
14 Wafer housing portion
14a Peripheral wall
14b Annular step portion
14c Wafer supporting projection
14d Bottom plate
14e Annular projection
X Height difference
c Boundary line

DETAILED DESCRIPTION OF PREFERRED EMBODIMENTS

The embodiments of the present invention are specifically explained below. The first embodiment is first explained with reference to FIGS. 1 to 8.

First Embodiment

Figure 2:
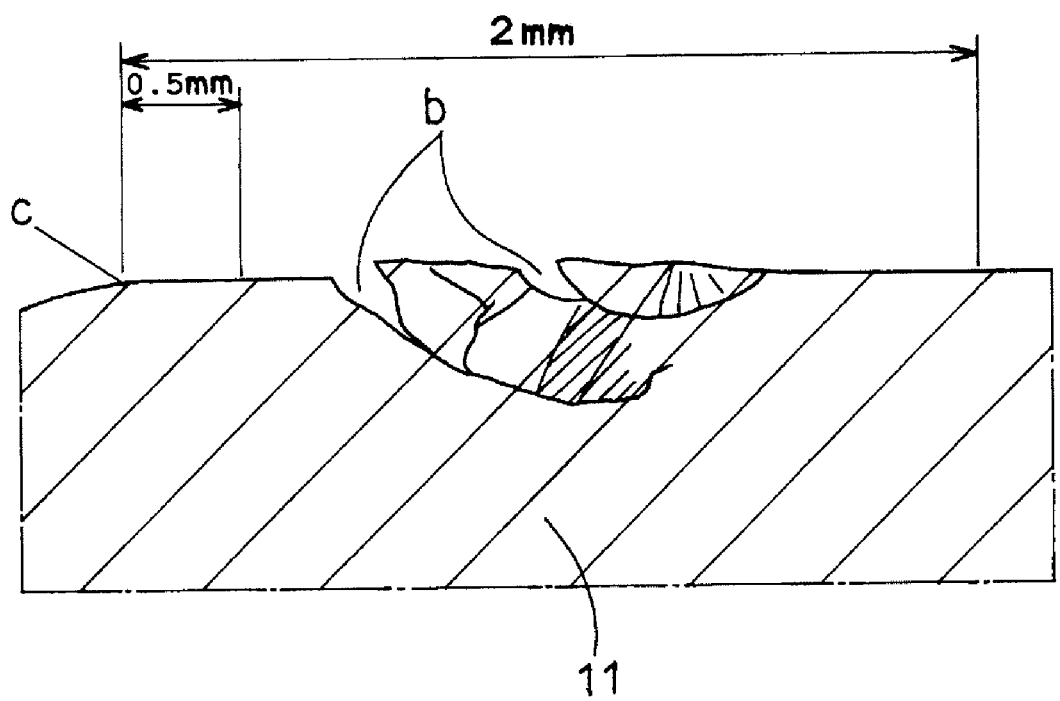
FIG. 2 is an enlarged vertical cross-sectional view of a scratch on the epitaxial wafer obtained in the method of growing the epitaxial film using the wafer supporting structure, according to the first embodiment of the present invention.

An epitaxial wafer 10 of FIG. 1 is obtained by vapor-phase epitaxial growth, by using a vapor-phase epitaxial growth apparatus to which a wafer supporting structure according to the first embodiment of the present invention is applied. An epitaxial film 12 is grown on a front surface of a silicon wafer (semiconductor wafer) 11 of the epitaxial wafer 10. No scratch b exists in a boundary area a with a chamfered surface (FIG. 2) of a rear surface of the silicon wafer 11. Of the rear surface of the silicon wafer 11, however, the scratch b exists in an area of 2 mm from a boundary line c with the chamfered surface toward a center position of the wafer (ring band shaped area). The boundary area a herein is an area having a ring band shape of 0.5 mm inward and 0.5 mm outward in a radius direction of the wafer, centering the boundary line c between the rear surface and the chamfered surface of the silicon wafer 11 (annular line formed as a flat surface and a curved surface are contacted). The scratch b is a rip-like or cut-like scratch existing on the wafer surface and having a depth of 0.5 µm or greater and a length of 1 µm or greater (FIG. 2).

Figure 3:
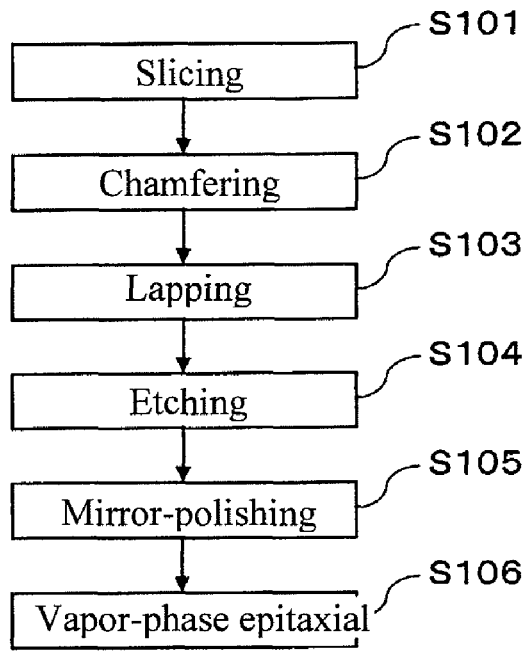
FIG. 3 is a flow sheet illustrating the method of growing the epitaxial film using the wafer supporting structure, according to the first embodiment of the present invention.

A method of producing the epitaxial wafer 10 is explained below with reference to a flow sheet of FIG. 3. The silicon wafer 11 is first prepared by slicing a monocrystalline silicon ingot pulled in the CZ process (S101). The silicon wafer 11 is added with boron as a dopant, until a specific resistance of the silicon wafer 11 reaches 10 mΩ·cm.

The silicon wafer 11, which is sliced into a thickness of about 900 µm and a diameter of 12 inches, is then chamfered in a peripheral edge portion thereof by a grind stone for chamfering in a chamfering process (S102). Thereby, the peripheral edge portion of the silicon wafer 11 has predetermined roundness from a cross-sectional view. In a subsequent lapping process, the chamfered silicon wafer 11 is lapped by a lapping machine (S103). In an etching process thereafter, the lapped wafer is immersed in a predetermined etching solution and ultrapure water (mixed acid or alkali+mixed acid), and thereby deformation in the lapping process, chamfered process, and the like is removed (S104). In this case, etching is performed about 20 µm on one side and about 40 µm on both sides. Thereafter, the silicon wafer 11 is fixed to a polishing plate, and then mirror-polished (S105).

Subsequently, the silicon wafer 11 is placed in a chamber (reaction furnace or reaction chamber) of a single-wafer type vapor-phase epitaxial growth apparatus. Then, the epitaxial film 12 is grown on the front surface of the silicon wafer 11 in a vapor-phase epitaxial method (S106). The epitaxial growth process using the vapor-phase epitaxial growth apparatus (method of growing the epitaxial film) is specifically explained below with reference to FIG. 4.

Figure 4:
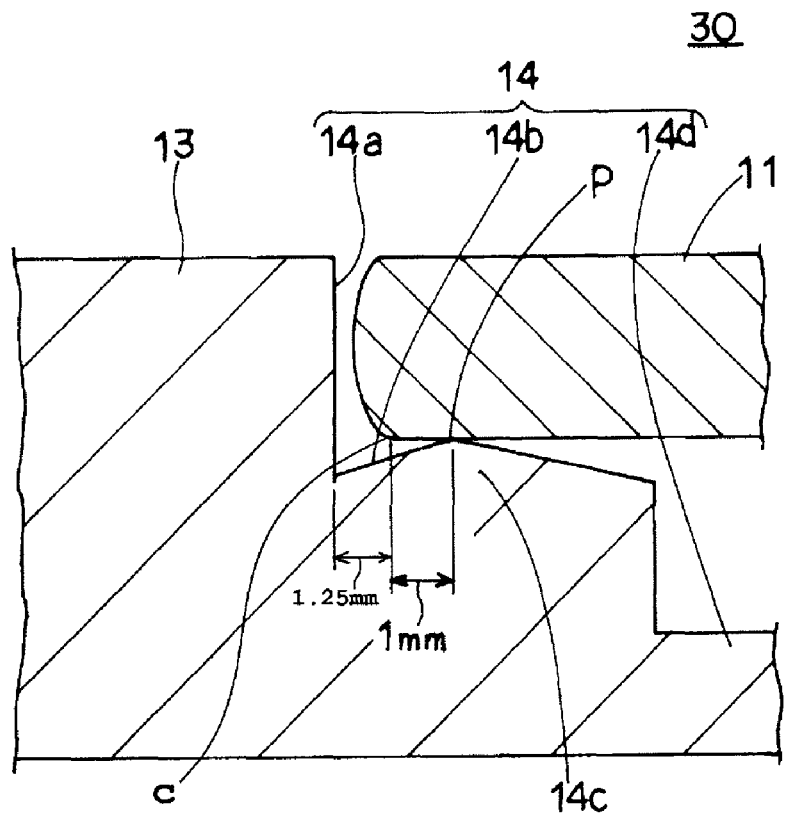
FIG. 4 is an enlarged cross-sectional view of a main portion of a vapor-phase epitaxial growth apparatus mounted with the wafer supporting structure, according to the first embodiment of the present invention.

As shown in FIG. 4, a vapor-phase epitaxial growth apparatus 30 has a susceptor 13 provided horizontally in a middle portion of a chamber to which heaters are provided above and below, the susceptor 13 having a circular shape from a plan view and being mountable with a single wafer. The susceptor 13 is formed of a carbon substrate coated with SiC. The semiconductor wafer 11 is housed laterally (front and rear surfaces in a horizontal state) in a recess-shaped wafer housing portion (caved-in portion) 14 provided in a middle portion of an upper surface of the susceptor 13. The wafer housing portion 14 is demarcated by a peripheral wall 14a, an annular step portion 14b from a plan view having a width of 6 mm, and a bottom plate (bottom wall surface of the caved-in portion) 14d. The peripheral wall 14a is provided with a height, such that an upper end surface of the peripheral wall 14a (upper surface of a shoulder end portion) is flush with the wafer front surface. An annular wafer supporting projection 14c having a cross-sectionally triangular shape is integrally provided to an upper surface of the annular step portion 14b. The wafer supporting projection 14c is provided with an apex (wafer supporting position P) at a position of 2.25 mm from an external peripheral edge toward the wafer center position.

Figure 5:
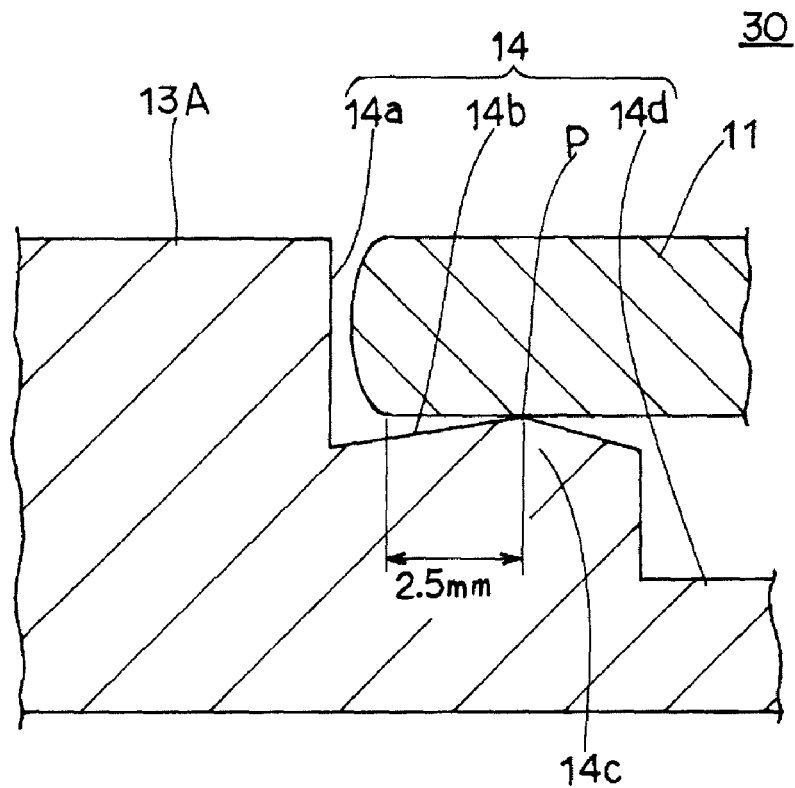
FIG. 5 is an enlarged cross-sectional view of a main portion of a vapor-phase epitaxial growth apparatus mounted with an alternative wafer supporting structure, according to the first embodiment of the present invention.
Figure 6:
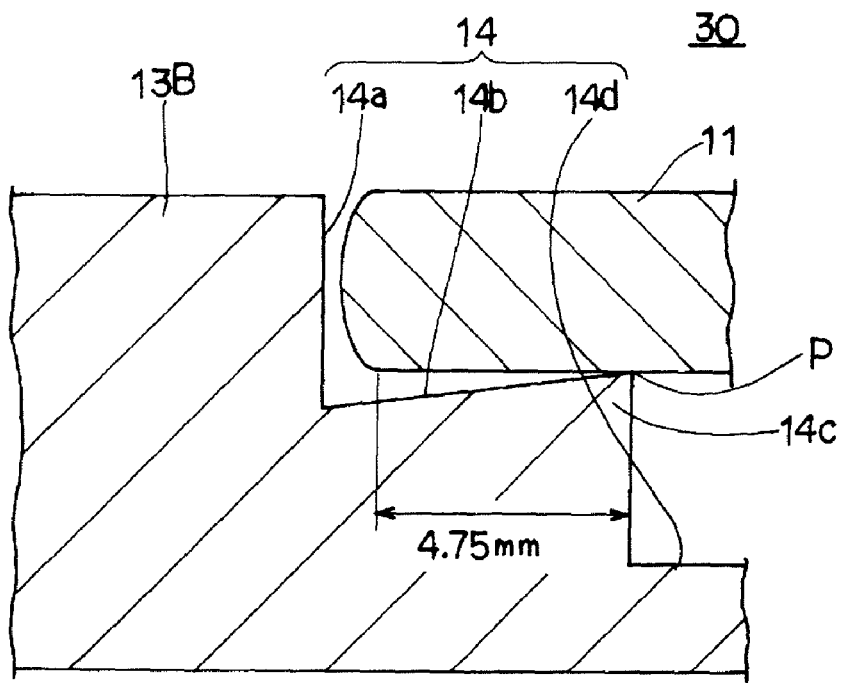
FIG. 6 is an enlarged cross-sectional view of a main portion of a vapor-phase epitaxial growth apparatus mounted with a further alternative wafer supporting structure, according to the first embodiment of the present invention.
Figure 7:
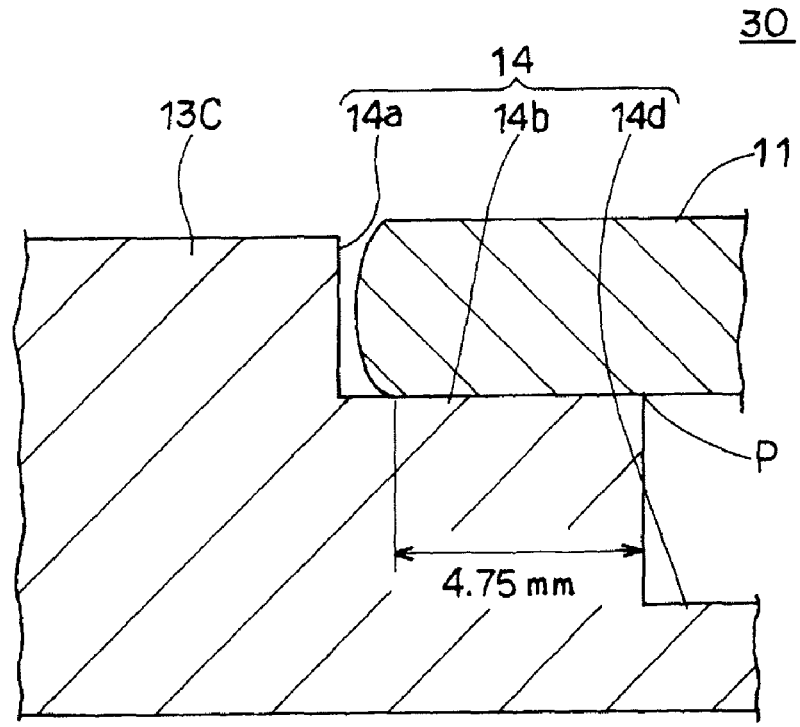
FIG. 7 is an enlarged cross-sectional view of a main portion of a vapor-phase epitaxial growth apparatus mounted with another wafer supporting structure, according to the first embodiment of the present invention.

Alternatively, the apex of the wafer supporting projection 14c may be provided at a position of 3.75 mm from the external peripheral edge of the annular step portion 14b toward the wafer center position (FIG. 5). Further, the apex may be provided at a position of 6 mm from the external peripheral edge of the annular step portion 14b toward the wafer center position (FIG. 6). The supporting position of the rear surface of the silicon wafer 11 in FIG. 5 is provided at 2.5 mm from the boundary line c with the chamfered surface toward the wafer center position. The supporting position of the rear surface of the silicon wafer in FIG. 6 is provided at 4.75 mm from the boundary line c with the chamfered surface toward the wafer center position. In addition, the susceptor 13 may be the annular step portion 14b having a flat upper surface. (FIG. 7). In this case, when the silicon wafer 11 is placed on the annular step portion 14b, an upper edge of an internal periphery of the annular step portion 14b is the wafer supporting point P, due to self-weight of the silicon wafer 11 similar to the case of the susceptor 13 of FIG. 6. A gas supply inlet is provided to a first side portion of the chamber to supply a predetermined carrier gas ($H_2$ gas) and a predetermined source gas ($SiHCl_3$ gas) to an upper space of the chamber, such that the gases flow in parallel to the wafer front surface. Further, a gas discharge outlet is provided to a second side portion of the chamber.

As shown in FIG. 4, the silicon wafer 11 is first placed in the wafer housing portion 14 of the susceptor 13 at the time of epitaxial growth. At the time, the wafer supporting projection 14c of the susceptor 13 comes in contact with the rear surface of the silicon wafer 11 at a position of 1 mm from the boundary line c with the chamfered surface toward the wafer center position. The contact is provided along an entire periphery of the silicon wafer 11 (FIG. 4). When the wafer housing portion 14 that includes at least the wafer supporting projection 14c has a rough surface, a minute gap is generated between the rear surface of the silicon wafer 11 and the wafer supporting projection 14c. Thus, a scratch on the wafer rear surface can be reduced, the scratch being caused by friction occurring between the silicon wafer 11 and the wafer supporting projection 14c when the silicon wafer 11 is housed in or removed from the wafer housing portion 14. The rough surface has an Ra value of 0.1 to 3 μm, for example. Subsequently, the epitaxial film 12 is grown on the front surface of the heated silicon wafer 11. Specifically, the carrier gas and the source gas are introduced into the chamber through the gas supply inlet. An internal pressure of the chamber is set to 100±20 KPa. Then, silicon, which is produced through pyrolysis or reduction of the source gas, is formed into a film at a reaction rate of 2 to 4 μm/minute, on the silicon wafer 11 heated to a temperature of 1,000° C. to 1,150° C. Thereby, the epitaxial film 12 is grown on the front surface of the silicon wafer 11, the epitaxial film 12 being formed of monocrystalline silicon having a thickness of 3 μm. Thus, the epitaxial wafer 10 is produced. The epitaxial wafer 10 is suitable as a P/P-type substrate for MOS products.

When a susceptor having a carbon substrate coated with SiC is used at the time of heating in the epitaxial growth, an area of 1 mm from the boundary line c toward the wafer center position on the wafer rear surface is in friction with the wafer supporting position P of the wafer supporting projection 14c of the susceptor 13. The friction occurs due to difference in a coefficient of thermal expansion between the silicon wafer 11 and the susceptor 13. Since front surface material of the susceptor 13 is SiC, which is harder than the silicon wafer 11, the scratch b is generated in the area of the wafer rear surface (FIG. 2). In other words, no scratch b is generated in the boundary area a on the rear side of the wafer external peripheral portion, the scratch b being a conventional problem in use of a susceptor. Thereby, the epitaxial wafer 10 having no scratch b existing in the boundary area a can be produced. The friction at the wafer supporting point P also occurs at a time of cooling in the epitaxial growth.

As a result, even when particles are generated from the scratch b in a device process in which the epitaxial wafer 10 is immersed in treatment solutions, such as, for example, an etching solution, ultrapure water, and the like, it is less likely that the particles move to the wafer front side and are deposited on the front surface of the epitaxial film 12. The reason is that a distance from the external peripheral end of the wafer rear surface to a position of the scratch b is longer. Thus, defective devices caused by deposition of particles on the wafer front surface are prevented from being produced, and thereby device yield can be increased.

Figure 8:
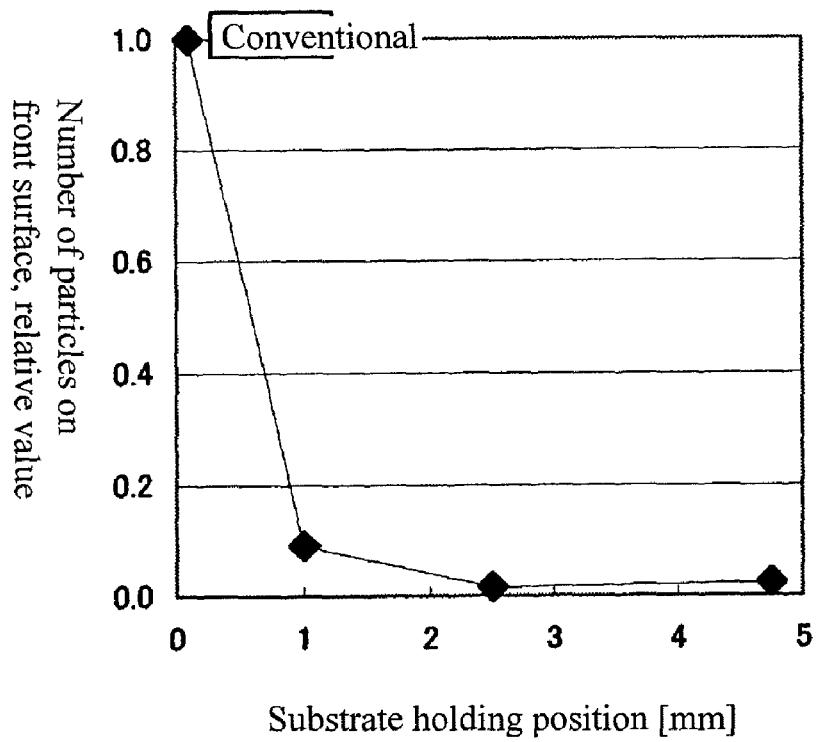
FIG. 8 is a graph illustrating a relationship between a wafer holding position and particles on a front surface of an epitaxial film.

With respect to the epitaxial wafer actually produced by the vapor-phase epitaxial growth apparatus provided with one of the susceptors shown in FIGS. 4 to 7, the graph of FIG. 8 illustrates a relationship between the wafer supporting position by the susceptor and the number of particles deposited on the front surface of the epitaxial film after immersion in the etching solution and ultrapure water described above. In the graph of FIG. 8, the number of particles when a conventional susceptor is used is set as a reference value of 1.0. The conventional susceptor has the silicon wafer supporting point at an area of 0.1 mm from the boundary line of the wafer rear surface toward the wafer center position. As shown in the graph of FIG. 8, the number of particles when the susceptor 13 shown in FIG. 4 is used is 0.092 (relative value). The number of particles when the susceptor 13A shown in FIG. 5 is used is 0.017. The number of particles when the susceptor 13B shown in FIG. 6 and the susceptor 13C shown in FIG. 7 are used is about 0.025 in both cases. The results in the case of the susceptors 13 and 13A to 13C are good, compared with the conventional product.

Figure 9:
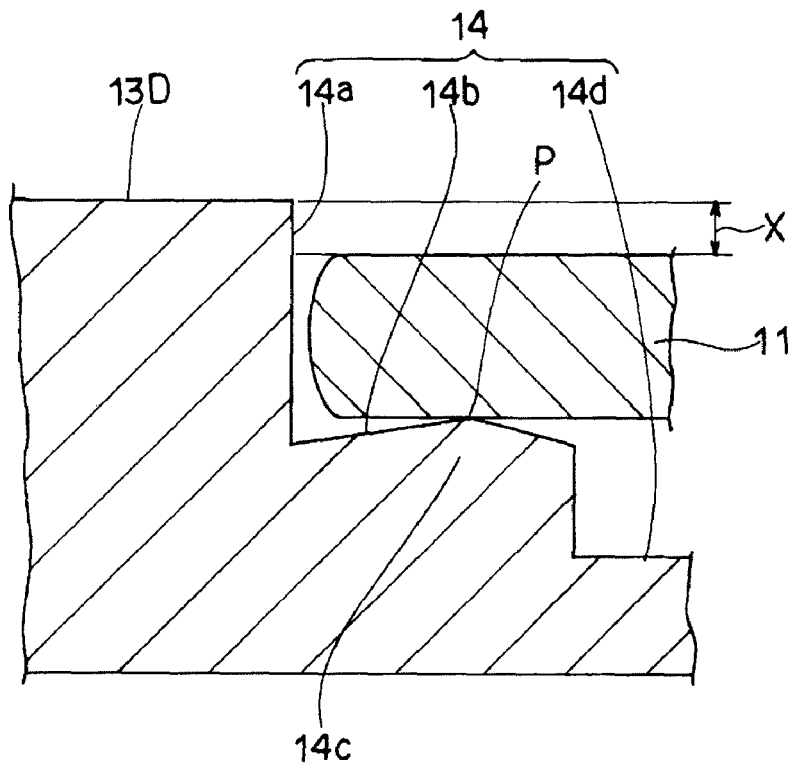
FIG. 9 is an enlarged cross-sectional view of a main portion of a vapor-phase epitaxial growth apparatus mounted with a wafer supporting structure, according to a second embodiment of the present invention.

A method of growing an epitaxial film and a wafer supporting structure according to the second embodiment of the present invention is explained below with reference to FIGS. 9 and 10. As shown in FIG. 9, the wafer supporting structure according to the second embodiment of the present invention has a feature in which an upper end surface of a peripheral wall 14a of a wafer housing portion 14 is higher than a front surface of a silicon wafer 11 housed in the wafer housing portion 14. Thereby, growth of silicon (film forming on a rear surface) can be avoided at an external peripheral end portion of the wafer rear surface, as source gas moves to the wafer rear surface side at a time of epitaxial growth. As a result, a fluctuation amount of a total thickness can be reduced at the external peripheral area of the silicon wafer 11, and a front surface of an epitaxial film 12 can be significantly flattened. Thus, ultra flatness of the front surface of the epitaxial film 12 can be achieved. Other structures, functions, and effects are identical to those of the first embodiment, and thus explanations thereof are omitted.

Figure 10:
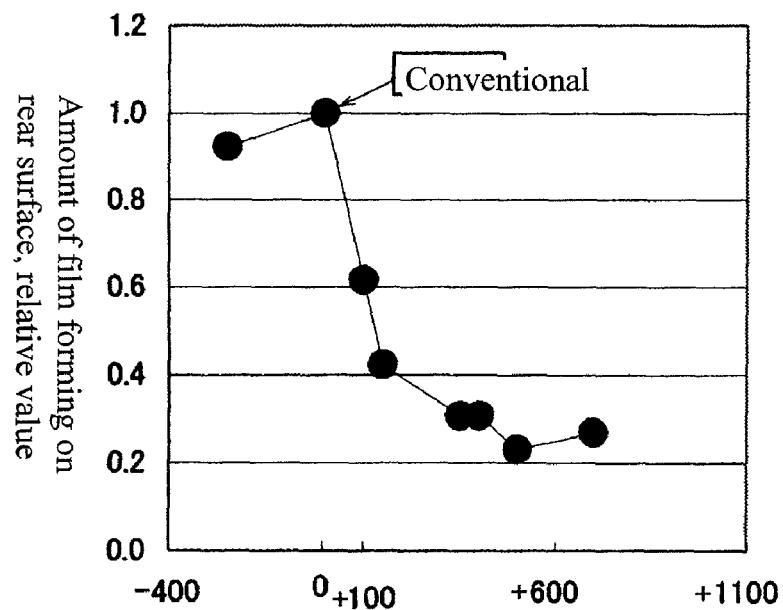
FIG. 10 is a graph illustrating a relationship between an amount of film forming on a wafer rear surface and a height difference of an upper surface of a shoulder end portion and an upper surface of a semiconductor wafer.

With respect to the epitaxial wafer 11 actually produced by a vapor-phase epitaxial growth apparatus provided with a susceptor shown in FIG. 9, a graph of FIG. 10 illustrates a relationship between a height difference X and an amount of film forming on the wafer rear surface, the height difference X being between an upper surface of a shoulder end portion of the wafer housing portion 14 and the front surface of the silicon wafer 11 housed in the wafer housing portion 14. The susceptor 13D of FIG. 9 is based on a susceptor provided with a wafer supporting point P of a wafer supporting projection 14c at a position of 3.75 mm from an external peripheral edge of an annular step portion 14b of the wafer housing portion 14 toward the wafer center position (FIG. 5).

In the graph of FIG. 10, the amount of film forming on the wafer rear surface (deposit amount) when a conventional susceptor having a height difference X=0 is used is set as a reference value of 1.0. As demonstrated in the graph of FIG. 10, when the height difference X is −250 μm (the upper surface of the shoulder end portion is lower than the front surface of the silicon wafer 11 by 250 μm), the amount of film forming on the wafer rear surface is 0.923 (relative value). When the height difference X is +100 μm (the upper surface of the shoulder end portion is higher than the front surface of the silicon wafer 11 by 100 μm), the amount of film forming on the wafer rear surface is 0.615. When the height difference X is +150 μm, the amount of film forming on the wafer rear surface is 0.423. When the height difference X is +350 μm, the amount of film forming on the wafer rear surface is about 0.308. When the height difference X is +400 μm, the amount of film forming on the wafer rear surface is 0.308. When the height difference X is +500 μm, the amount of film forming on the wafer rear surface is 0.231. When the height difference X is +700 μm, the amount of film forming on the wafer rear surface is 0.269. In any case, the amount of film forming on the wafer rear surface is reduced, compared with the conventional product.

Figure 11:
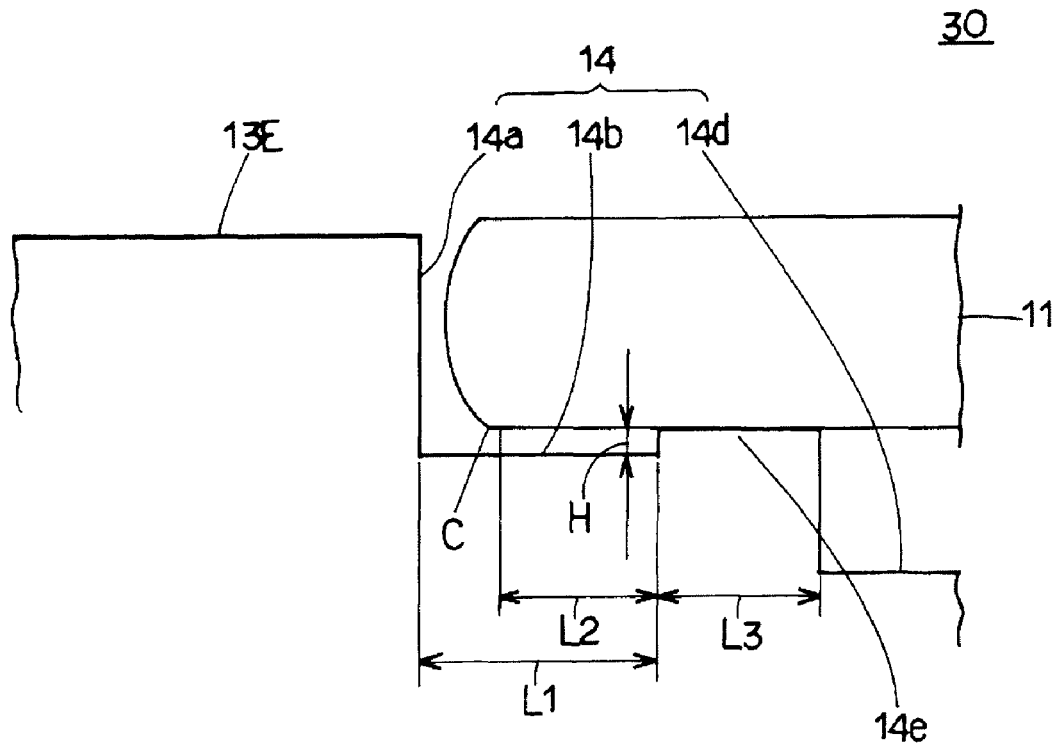
FIG. 11 is an enlarged cross-sectional view of a main portion of a vapor-phase epitaxial growth apparatus mounted with a susceptor and a wafer supporting structure, according to a third embodiment of the present invention.

A method of growing an epitaxial film, a wafer supporting structure, and a susceptor according to the third embodiment of the present invention is explained below with reference to FIGS. 11 to 13. As shown in FIG. 11, a susceptor 13E according to the third embodiment of the present invention has a feature in which the susceptor 13E has a wafer housing portion 14 provided with a bottom plate portion 14d, an annular step portion 14b provided to a periphery of the bottom plate portion 14d and supporting the silicon wafer 11 in surface contact, and a peripheral wall 14a provided to a periphery of the step portion 14b; and in which, of the annular step portion 14b, a portion in surface contact with a rear surface of the silicon wafer 11 is an annular projection 14e having a flat upper surface; and the annular projection 14e has a width L3 in a diameter direction of the step portion 14b of 2.5 mm and a height H from an upper surface of the step portion 14b of 50 μm, and is provided to the step portion having a distance from the peripheral wall 14a in the diameter direction of the step portion 14b (a length L1 is 3.5 mm, the length L1 being from the peripheral wall 14a toward an internal peripheral edge of the annular projection 14e in the diameter direction of the step portion 14b).

In the wafer supporting structure of the susceptor 13E according to the third embodiment, of the annular step portion 14b, the annular projection 14e having the flat upper surface is provided to the portion in surface contact with the rear surface of the silicon wafer 11. Further, the annular projection 14e has the width L3 of 2.5 mm in the diameter direction of the step portion 14b (width of the upper surface). Thus, it is possible to achieve reduction in damage to the wafer rear surface in the portion that comes in contact with the step portion 14b. In addition, the annular projection 14e has the height H of 50 μm from the upper surface of the step portion 14b, and the length L2 of 2.25 mm from a boundary line c in the wafer diameter direction to a supporting point of an external peripheral edge of the annular projection 14e. Thus, it is possible to concurrently achieve reduction in an amount of the film forming on the wafer rear surface due to source gas moving to the wafer rear surface side. The reduction in the film forming amount improves evenness of a thickness distribution within the wafer surface of the silicon wafer 11, thus facilitating achievement of ultra flatness of an epitaxial wafer 10. Other structures, functions, and effects are identical to those of the first embodiment, and thus explanations thereof are omitted.

Figure 12:
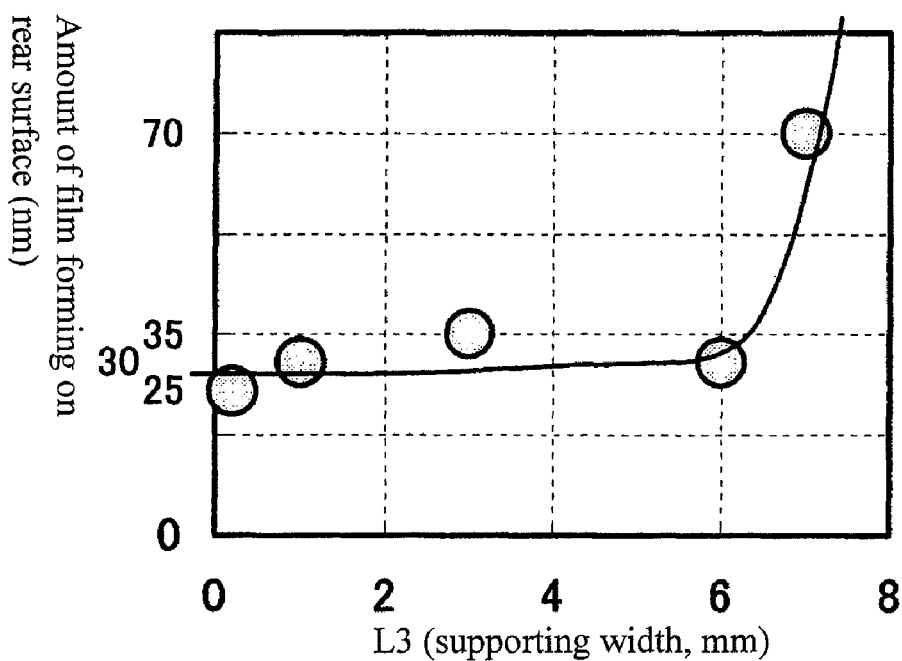
FIG. 12 is a graph illustrating a relationship between a width in a diameter direction of a step portion of an annular projection and an amount of film forming on a wafer rear surface.
Figure 13:
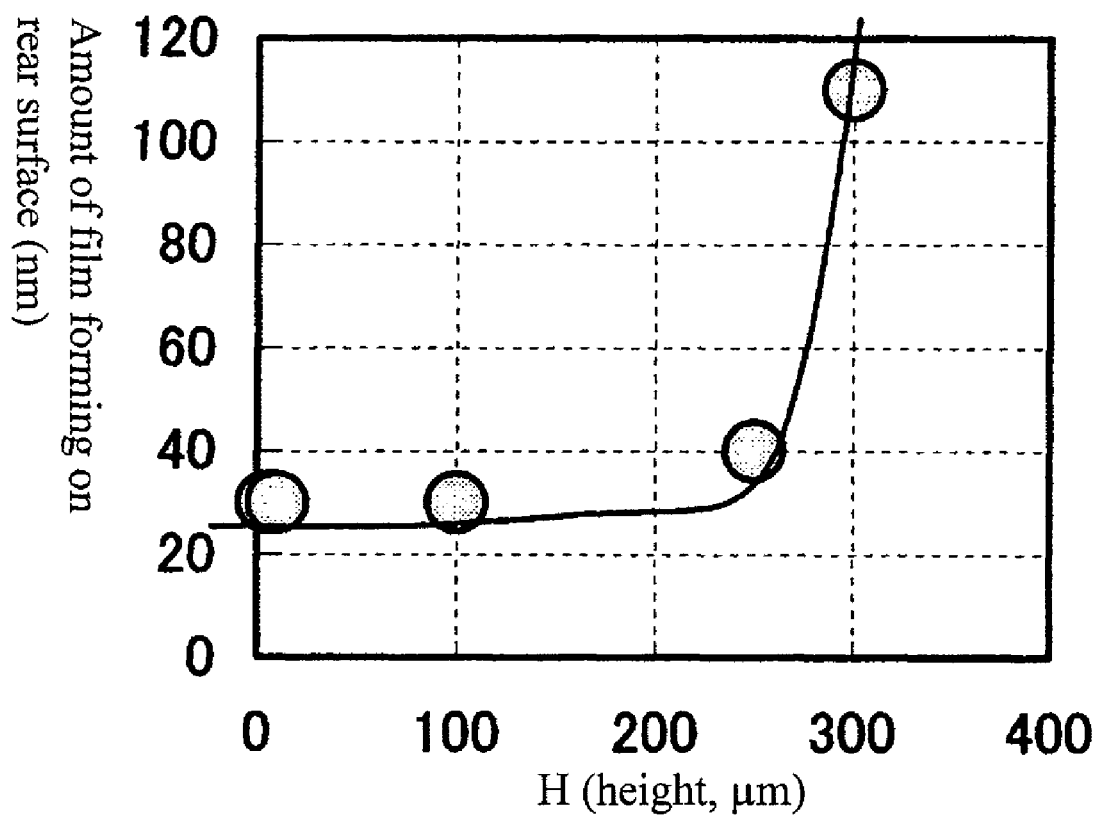
FIG. 13 is a graph illustrating a relationship between a height of the annular projection and the amount of film forming on the wafer rear surface.

With respect to the epitaxial wafer 11 actually produced by a vapor-phase epitaxial growth apparatus 30 provided with the susceptor 13E shown in FIG. 11, a graph of FIG. 12 illustrates a relationship between the width L3 of the annular projection 14e in the diameter direction of the step portion 14b, and an amount of film forming on the wafer rear surface. A graph of FIG. 13 illustrates a relationship between the height H of the annular projection 14e and the amount of film forming on the wafer rear surface.

As demonstrated in the graph of FIG. 12, the amount of film forming on the wafer rear surface is about 30 mm when the width L3 of the annular projection 14e is within a range of 1 to 6 mm. When the width L3 exceeds 6 mm, however, the film forming amount is drastically increased. As demonstrated in the graph of FIG. 13, meanwhile, the film forming amount is rapidly increased at a point at which the height H of the annular projection 14e exceeds 250 μm. When the width L3 of the annular projection 14e is 7 mm, for instance, the film forming amount reaches up to 70 nm. When the height H from the upper surface of the step portion 14b is within 10 to 250 μm, the amount of film forming on the wafer rear surface is about 30 mm. At the point at which the height H exceeds 250 μm, however, the film forming amount is rapidly increased. When the height H is 300 μm, for instance, the film forming amount reaches up to 110 nm.

The present invention is effective in production of epitaxial wafers to be used as substrates of MOS products, logic products, and the like.

What is claimed is:

1. A method of growing an epitaxial film in which a semiconductor wafer is housed in a wafer housing portion provided by caving in a portion of an upper surface of a susceptor, and an epitaxial film is grown on a front surface of the semiconductor wafer by vapor-phase epitaxial growth, wherein:
    the wafer housing portion is a space demarcated by a bottom plate portion constituting a bottom wall of the wafer housing portion; an annular step portion provided to a periphery of the bottom plate portion and supporting the semiconductor wafer; and a peripheral wall provided to a periphery of the annular step portion; and
    the epitaxial film is grown on the front surface of the semiconductor wafer, while a rear surface of the semiconductor wafer is in one of surface and line contact in a predetermined range of an area of 1 to 6 mm from a boundary line with a chamfered surface toward a center position of the wafer, and a predetermined position of the area is supported by an upper edge of an internal periphery of the annular step portion.

2. The method of growing the epitaxial film according to claim 1, wherein
    the rear surface of the semiconductor wafer and the upper edge of the internal periphery of the annular step portion are in surface contact;
    of the annular step portion, a portion in surface contact with the rear surface of the semiconductor wafer is an annular projection having a flat upper surface; and
    the annular projection has a width in a diameter direction of the annular step portion of 1 to 6 mm and a height from the upper surface of the annular step portion of 10 to 250 μm, and is provided to the annular step portion having a distance from the peripheral wall in the diameter direction of the annular step portion.

3. A wafer supporting structure when an epitaxial film is grown on a front surface of a semiconductor wafer placed on a susceptor in a vapor-phase epitaxial method, wherein:
- the susceptor comprises a wafer housing portion having a bottom plate portion, an annular step portion provided to a periphery of the bottom plate portion and supporting the semiconductor wafer, and a peripheral wall provided to a periphery of the annular step portion; and
- of a rear surface of the semiconductor wafer, a predetermined position of an area of 1 to 6 mm from a boundary line with a chamfered surface toward a center position of the wafer is supported by the annular step portion.

4. The wafer supporting structure according to claim 3, wherein the semiconductor wafer is supported while being in surface contact with the annular step portion.

5. The wafer supporting structure according to claim 4, wherein:
- of the annular step portion, a portion in surface contact with the rear surface of the semiconductor wafer is an annular projection having a flat upper surface; and
- the annular projection has a width in a diameter direction of the annular step portion of 1 to 6 mm and a height from the upper surface of the annular step portion of 10 to 250 μm, and is provided to the annular step portion having a distance from the peripheral wall in the diameter direction of the annular step portion.

6. The wafer supporting structure according to claim 3, wherein the semiconductor wafer is supported while being in line contact with the annular step portion.

7. The wafer supporting structure according to claim 3, wherein:
- an upper end surface of the peripheral wall of the wafer housing portion is higher than the front surface of the semiconductor wafer housed in the wafer housing portion; and
- a height difference is 100 to 500 μm between the upper end surface of the peripheral wall of the wafer housing portion and the front surface of the semiconductor wafer.

8. A susceptor on which a semiconductor wafer is placed when an epitaxial film is grown on a front surface of the semiconductor wafer in a vapor-phase epitaxial method, wherein:
- the susceptor comprises a wafer housing portion having a bottom plate portion, an annular step portion provided to a periphery of the bottom plate portion and supporting the semiconductor wafer in surface contact, and a peripheral wall provided to a periphery of the annular step portion;
- of the annular step portion, a portion in surface contact with a rear surface of the semiconductor wafer is an annular projection having a flat upper surface; and
- the annular projection has a width in a diameter direction of the annular step portion of 1 to 6 mm and a height from the upper surface of the annular step portion of 10 to 250 μm, and is provided to the annular step portion having a distance from the peripheral wall in the diameter direction of the annular step portion.

9. The wafer supporting structure according to claim 4, wherein:
- an upper end surface of the peripheral wall of the wafer housing portion is higher than the front surface of the semiconductor wafer housed in the wafer housing portion; and
- a height difference is 100 to 500 μm between the upper end surface of the peripheral wall of the wafer housing portion and the front surface of the semiconductor wafer.

10. The wafer supporting structure according to claim 5, wherein:
- an upper end surface of the peripheral wall of the wafer housing portion is higher than the front surface of the semiconductor wafer housed in the wafer housing portion; and
- a height difference is 100 to 500 μm between the upper end surface of the peripheral wall of the wafer housing portion and the front surface of the semiconductor wafer.

11. The wafer supporting structure according to claim 6, wherein:
- an upper end surface of the peripheral wall of the wafer housing portion is higher than the front surface of the semiconductor wafer housed in the wafer housing portion; and
- a height difference is 100 to 500 μm between the upper end surface of the peripheral wall of the wafer housing portion and the front surface of the semiconductor wafer.

* * * * *